United States Patent
Moon et al.

(10) Patent No.: US 8,497,157 B2
(45) Date of Patent: Jul. 30, 2013

(54) METHOD OF MANUFACTURING A SEMICONDUCTOR DEVICE AND METHOD OF MANUFACTURING A SEMICONDUCTOR PACKAGE INCLUDING THE SAME

(75) Inventors: Kwang-Jin Moon, Suwon-si (KR); Byung-Lyul Park, Seoul (KR); Do-Sun Lee, Gwangju (KR); Gil-Heyun Choi, Seoul (KR); Suk-Chul Bang, Yongin-si (KR); Dong-Chan Lim, Suwon-si (KR); Deok-Young Jung, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/459,468

(22) Filed: Apr. 30, 2012

(65) Prior Publication Data

US 2012/0282736 A1   Nov. 8, 2012

(30) Foreign Application Priority Data

May 4, 2011   (KR) ........................ 10-2011-0042404

(51) Int. Cl.
*H01L 21/00* (2006.01)
*H01L 21/324* (2006.01)

(52) U.S. Cl.
USPC ........... 438/107; 438/631; 438/660; 438/667; 257/E21.588

(58) Field of Classification Search
USPC ................ 438/107–109, 631, 633, 660, 667, 438/632, 661; 257/E21.506, E21.511, E21.588
See application file for complete search history.

(56) References Cited

U.S. PATENT DOCUMENTS

| | | | | |
|---|---|---|---|---|
| 5,877,084 A | * | 3/1999 | Joshi et al. | 438/646 |
| 6,399,486 B1 | * | 6/2002 | Chen et al. | 438/660 |
| 6,599,828 B1 | * | 7/2003 | Gardner | 438/632 |
| 8,134,231 B2 | * | 3/2012 | Sano et al. | 257/706 |
| 2010/0015805 A1 | * | 1/2010 | Mayer et al. | 438/692 |
| 2011/0031581 A1 | * | 2/2011 | West | 257/508 |

FOREIGN PATENT DOCUMENTS

| | | |
|---|---|---|
| JP | 2003-163452 | 6/2003 |
| JP | 2007-053206 | 3/2007 |
| KR | 102010-0045333 A | 5/2010 |

* cited by examiner

*Primary Examiner* — Tuan N. Quach
(74) *Attorney, Agent, or Firm* — Muir Patent Consulting, PLLC

(57) ABSTRACT

In a method of manufacturing a semiconductor device, a front end of line (FEOL) process may be performed on a semiconductor substrate to form a semiconductor structure. A back end of line (BEOL) process may be performed on the semiconductor substrate to form a wiring structure electrically connected to the semiconductor structure, thereby formed a semiconductor chip. A hole may be formed through a part of the semiconductor chip. A preliminary plug may have a dimple in the hole. The preliminary plug may be expanded into the dimple by a thermal treatment process to form a plug. Thus, the plug may not have a protrusion protruding from the upper surface of the semiconductor chip, so that the plug may be formed by the single CMP process.

14 Claims, 8 Drawing Sheets

METHOD OF MANUFACTURING A SEMICONDUCTOR DEVICE AND METHOD OF MANUFACTURING A SEMICONDUCTOR PACKAGE INCLUDING THE SAME

CROSS-REFERENCE TO RELATED APPLICATION

This application claims priority under 35 USC §119 to Korean Patent Application No. 10-2011-0042404, filed on May 4, 2011 in the Korean Intellectual Property Office (KIPO), the contents of which are herein incorporated by reference in their entirety.

BACKGROUND

Example embodiments relate to a method of manufacturing a semiconductor device and a method of manufacturing a semiconductor package including the same. More particularly, example embodiments relate to a method of manufacturing a semiconductor device including a plug that may be used for stacking semiconductor chips, and a method of manufacturing a semiconductor package including the method.

Generally, a plurality of semiconductor fabrication processes may be performed on and/or in a semiconductor substrate to form a plurality of semiconductor chips. In order to mount the semiconductor chips on a printed circuit board (PCB), a packaging process may be performed on the semiconductor chips to form semiconductor packages.

In order to increase storage capacity of the semiconductor package, a multi-chip package including sequentially stacked semiconductor chips may be widely developed. An electrical medium such as a conductive wire, a plug, etc., may be used for electrically connecting the stacked semiconductor chips to each other.

To form a plug, a front end of line (FEOL) process may be performed on and/or in a semiconductor substrate. A hole may be formed through a part of a semiconductor chip. The hole may be filled with a preliminary plug. The preliminary plug may be partially formed at an upper portion of the semiconductor chip. Thus, the preliminary plug at the upper portion of the semiconductor chip may be removed by a primary chemical mechanical polishing (CMP) process. The preliminary plug may then be thermally treated. The thermally treated preliminary plug may expand in an upward direction. Thus, the expanded preliminary plug may have a protrusion protruded from the upper surface of the preliminary plug. The protrusion of the preliminary plug may be removed by a secondary CMP process.

The above-mentioned related method may include two CMP processes. Thus, the related method may include complicated processes and take a relatively long time.

SUMMARY

Example embodiments provide a method of manufacturing a semiconductor device that may be capable of forming a plug by a single CMP process.

Example embodiments also provide a method of manufacturing a semiconductor package including the above-mentioned method.

According to some example embodiments, there is provided a method of manufacturing a semiconductor device. In the method of manufacturing the semiconductor device, a front end of line (FEOL) process may be performed on a semiconductor substrate to form a semiconductor structure. A back end of line (BEOL) process may be performed on the semiconductor substrate to form a wiring structure electrically connected to the semiconductor structure, and thereby may form a semiconductor chip. A hole may be formed through a part of the semiconductor chip. A preliminary plug having a dimple may be formed in the hole. The preliminary plug may be expanded into the dimple by a thermal treatment process to form a plug.

In example embodiments, forming the hole and the preliminary plug may include forming a hole through the semiconductor substrate, forming a seed layer on an inner surface of the hole, and performing a plating process on the seed layer.

In example embodiments, forming the preliminary plug may further include forming a vertical plug in the hole and forming a plating material on the part of the semiconductor chip adjacent to the hole, and removing a portion of the preliminary plug. The portion of the preliminary plug may be removed by a CMP process.

In example embodiments, the dimple may have a volume of no more than about 2% of a volume of the hole.

In example embodiments, the thermal treatment process may include an annealing process. The annealing process may be performed at a temperature of about 400° C. to about 500° C.

In example embodiments, the method may further include removing a bottom surface of the dimple to further form the preliminary plug to have a second dimple that may have a depth deeper than that of the dimple. The bottom surface of the dimple may be removed by a wet etching process.

In example embodiments, forming the preliminary plug may include electrically connecting the preliminary plug to the semiconductor structure.

In example embodiments, forming the preliminary plug may include electrically connecting the preliminary plug to the wiring structure.

According to some example embodiments, there is provided a method of manufacturing a semiconductor package. In the method of manufacturing the semiconductor package, a front end of line (FEOL) process and a back end of line (BEOL) process may be performed on a semiconductor substrate to form a first semiconductor chip. A hole may be formed through at least part of the first semiconductor chip. A vertical plug having a dimple may be formed in the hole. A material of the vertical plug may be expanded into the dimple by a thermal treatment process to form a plug. The first semiconductor chip may be stacked on an upper surface of a package substrate. The first semiconductor chip may be electrically connected to the package substrate. A second semiconductor chip may be stacked on the first semiconductor chip. The plug may be electrically connected to the second semiconductor chip.

In example embodiments, the method may further include, prior to thermally treating the material comprising the vertical plug, removing a bottom surface of the dimple to form a second vertical plug having a second dimple that may have a depth deeper than that of the dimple. The bottom surface of the dimple may be removed by a wet etching process.

In example embodiments, the method may further include forming a molding member on the upper surface of the package substrate to cover the first semiconductor chip and the second semiconductor chip, and mounting external terminals on a lower surface of the package substrate.

According to some example embodiments, the preliminary plug may be expanded into the dimple by the thermal treatment process. Thus, the plug may not have a protrusion protruded from the upper surface of the plug. As a result, the plug may be formed by the single CMP process.

According to some example embodiments, there is provided a method of manufacturing a semiconductor device. In the method of manufacturing a semiconductor device, a semiconductor chip may be formed. A vertical hole may be formed through at least part of the semiconductor chip and the vertical hole extends horizontally between a first sidewall and a second sidewall. A conductive material may be formed in the hole. The conductive material may fills a lower portion of the hole and includes a recess having a predetermined size. In the lower portion, the conductive material may extend horizontally from the first sidewall to the second sidewall. In the upper portion, the conductive material does not extend horizontally between the first sidewall and the second sidewall to thereby form the recess. Thermally treating the conductive material until the conductive material in the upper portion extends horizontally from the first sidewall to the second sidewall, thereby filling the recess.

BRIEF DESCRIPTION OF THE DRAWINGS

Example embodiments will be more clearly understood from the following detailed description taken in conjunction with the accompanying drawings.

FIGS. 1 to 8 are cross-sectional views illustrating a method of manufacturing a semiconductor device in accordance with example embodiments;

FIGS. 9 to 16 are cross-sectional views illustrating a method of manufacturing a semiconductor device in accordance with other example embodiments;

FIG. 17 is a cross-sectional view illustrating a method of packaging the semiconductor device in FIG. 8 according to one embodiment; and FIG. 18 is a cross-sectional view illustrating a method of packaging the semiconductor device in FIG. 16 according to one embodiment.

DETAILED DESCRIPTION OF THE EMBODIMENTS

Figure 1:
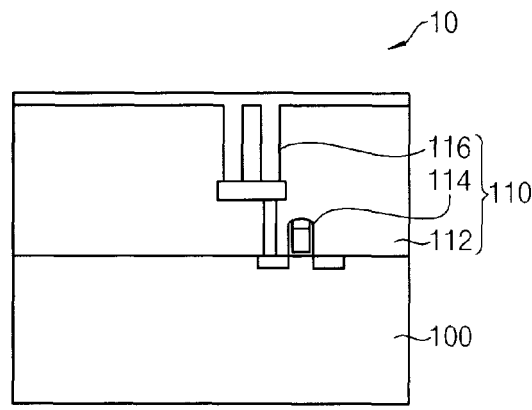
FIGS. 1 to 18 represent non-limiting, example embodiments as described herein.

Various example embodiments will be described more fully hereinafter with reference to the accompanying drawings, in which some example embodiments are shown. The present disclosure may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Method of Manufacturing a Semiconductor Device

FIGS. 1 to 8 are cross-sectional views illustrating a method of manufacturing a semiconductor device in accordance with example embodiments.

Referring to FIG. 1, a front end of line (FEOL) process may be performed on a semiconductor substrate 100 to form a semiconductor structure 110. A part 10 of a semiconductor chip may include the semiconductor substrate 100 and the semiconductor structure 110.

In example embodiments, the semiconductor structure 110 may include an insulating interlayer 112, a transistor 114 and a metal contact 116. For example, the transistor 114 can be part of a group of transistors that form a CMOS device. The transistor may be formed on and/or in the semiconductor substrate 100. The insulating interlayer 112 may be formed on the transistor 114. The metal contact 116 may be formed in the insulating interlayer 112 to electrically connect the metal contact 116 with the transistor 114. In one embodiment, the FEOL process may refer to a process including only forming the metal contact 116 and not including forming the transistor 114.

Figure 2:
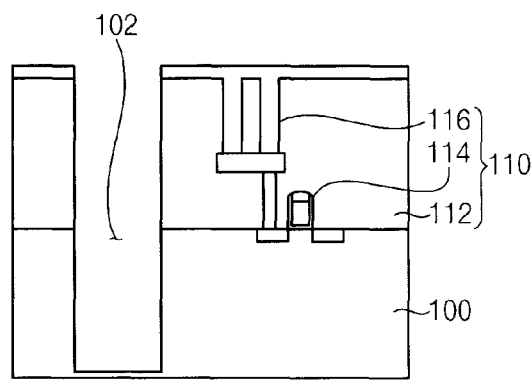

Referring to FIG. 2, a hole 102 may be vertically formed through a part of the semiconductor chip. In example embodiments, the hole 102 may be formed from an upper surface of the part 10 of a semiconductor chip toward a lower surface of the semiconductor substrate 100. The hole 102 may have a first sidewall and a second sidewall opposite to the first sidewall. The hole 102 may not be exposed through the lower surface of the semiconductor substrate 100. Alternatively, the hole 102 may be exposed through the lower surface of the semiconductor substrate 100.

Figure 3:
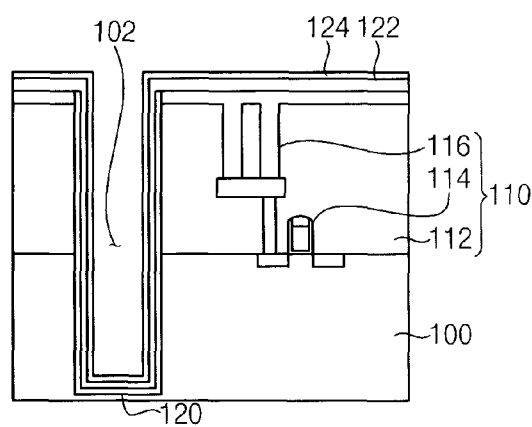

Referring to FIG. 3, an insulating liner 120 may be formed on an inner surface of the hole 102. A metal barrier layer 122 and a seed layer 124 may be sequentially formed on the insulating liner 120 and on a surface of the part 10 of the semiconductor chip. In example embodiments, the insulating liner 120 may include an oxide layer, a nitride layer, etc. A plug (not shown) may grow from the seed layer 124. Thus, a material of the plug may be determined in accordance with a material of the seed layer 124. The seed layer 124 may include a copper layer, an aluminum layer, etc.

Figure 4:
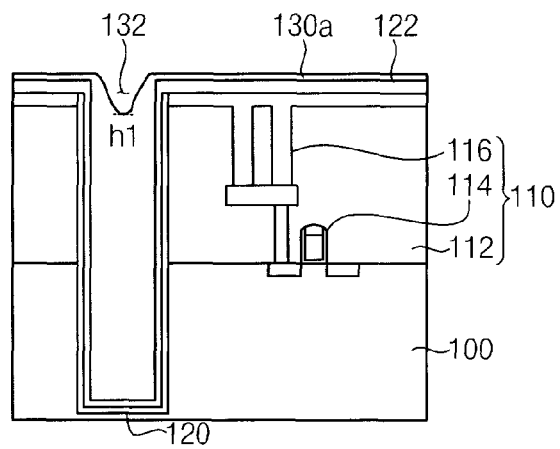

Referring to FIG. 4, a plating process may be performed on the seed layer 124 to form a preliminary plug, such as a first preliminary plug 130a in the hole 102 and on the upper surface of the part of a semiconductor chip adjacent to the hole. The first preliminary plug 130a may be grown from the seed layer 124. In example embodiments, the first preliminary plug 130a may be formed in the hole 102 and on the upper surface of the part of the semiconductor chip adjacent to the hole. The first preliminary plug 130a may be electrically connected to the semiconductor structure 110. As shown in FIG. 4, the first preliminary plug 130a may include a vertical plug in the hole 102, and additional plating material formed outside the hole 102.

In example embodiments, the first preliminary plug 130a may have a first dimple 132 (e.g., recess). The first dimple 132 may be located at an upper portion of the first preliminary plug 130a in the hole 102. The first dimple 132 may function to provide a space configured to receive an expanded portion of the first preliminary plug 130a during a following thermal treatment process. Thus, although the first preliminary plug 130a may be expanded during the thermal treatment process, a protruding portion of the vertical plug in the hole 102 above the height of the upper surface of the part 10 of the semiconductor chip may be minimized or avoided. The first dimple 132 may be formed by properly controlling the plating process on the seed layer 124. The first dimple 132 may have a volume, for example, greater than about 0.1% and less than about 2% of a volume of the hole 102 taking a thermal expansion coefficient of a material of the first preliminary plug 130a and a temperature of the thermal treatment process into consideration. For example, in one embodiment, the preliminary plug 130a is made of a conductive material that entirely extends between sidewalls at a first part (e.g., a part up to first height h1) of the hole, but at a second part (e.g., a part above the first height h1), has a space with no conductive material as shown by the first dimple 132.

In example embodiments, the plating material disposed on the upper surface of the part of the semiconductor chip adjacent to the hole may have a smaller thickness than if no dimple was used. That is, because the plating process may be completed before filling the first dimple 132 with the first preliminary plug 130a, the plating material disposed on the upper surface of the part of a semiconductor chip adjacent to the hole may have the small thickness. Therefore, in some embodiments, when a portion of the first preliminary plug 130a may be removed by a chemical mechanical polishing (CMP) process, a time for performing the CMP process is remarkably reduced.

Figure 5:
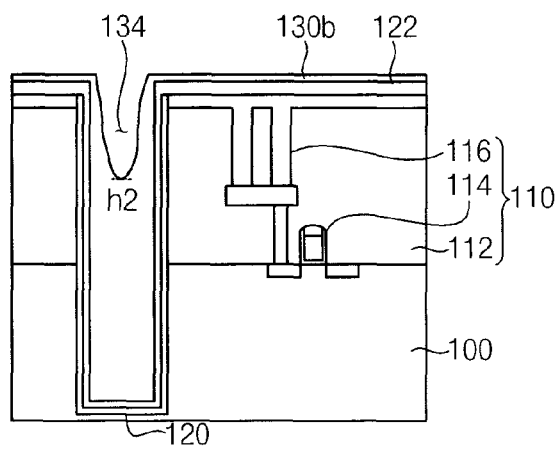

Referring to FIG. 5, if the first dimple 132 has a size smaller than an amount that the first preliminary plug 130a is expected to expand, a bottom surface of the first dimple 132 may be partially removed to form a second dimple 134 having a depth deeper than that of the first dimple 132. A second preliminary plug 130b may be formed with the second dimple 132. In example embodiments, the second dimple 134 of the second preliminary plug 130b may be formed by wet-etching the first preliminary plug 130a. Further, the plating process and the wet-etching process may be performed by an in-situ process. For example, after the second preliminary plug 130b has been formed, the second preliminary plug 130b entirely extends between sidewalls at a first part (e.g., a part up to a second height h2) of the hole, but at a second part (e.g., a part above the second height h2), has a space with no conductive material as shown by the second dimple 134.

However, in one embodiment, if the first dimple 132 has a large size configured to sufficiently receive the expanded portion of the first preliminary plug 130a, the process for forming the second dimple 134 may be omitted.

Figure 6:
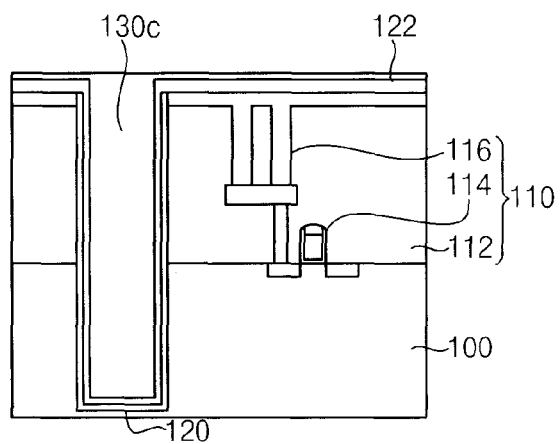

Referring to FIG. 6, the first or second preliminary plug 130a, 130b may then be thermally treated. The first or second preliminary plug 130a, 130b may be expanded into the first dimple 132 or the second dimple 134 by a heat applied to the first or second preliminary plug 130a, 130b to form a third preliminary plug 130c without the first dimple 132 or the second dimple 134, respectively. Accordingly, the conductive material may be filled in the first dimple 132 or the second dimple 134 to form the third preliminary plug 130c. In example embodiments, because the third preliminary plug 130c may not have a protrusion protruding above a top surface of the hole and/or a top surface of the remaining plating material outside the hole, a CMP process for removing the protrusion may be omitted. The thermal treatment process may include an annealing process. For example, the annealing process may be performed at a temperature of about 400° C. to about 500° C.

Figure 7:
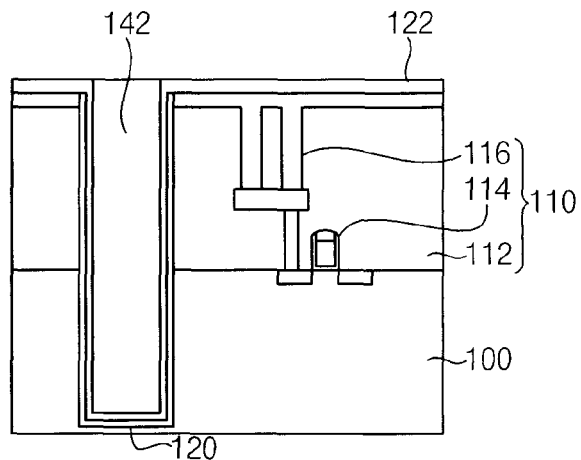

Referring to FIG. 7, a CMP process may be performed on the third preliminary plug 130c to form a plug 142. A partial portion of the third preliminary plug 130c may be removed by the CMP process. As a result, a vertical plug is formed to have a top surface that coincide with a top surface of the part 10 of the semiconductor chip, and to completely fill the hole 102.

Figure 8:
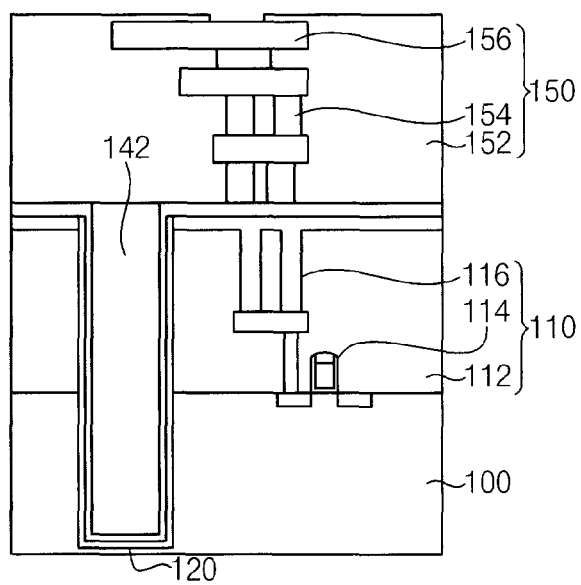

Referring to FIG. 8, a back end of line (BEOL) process may be performed on the part 10 of the semiconductor chip to form a wiring structure 150. The wiring structure 150 may be electrically connected to the plug 142 and the semiconductor structure 110.

In one embodiment, a semiconductor chip may include the semiconductor substrate 100, the semiconductor structure 110, the wiring structure 150, and the plug 142.

In example embodiments, the wiring structure 150 may include a passivation layer 152, a metal contact 154 and a pad 156. The passivation layer 152 may be formed on the insulating interlayer 112. The metal contact 154 may be formed in the passivation layer 152. The metal contact 154 may be electrically connected to the plug 142. The pad 156 may be formed on the metal contact 154. A bump (not shown), which may be electrically connected to other substrates, may be formed on the pad 156.

In example embodiments, the lower surface of the semiconductor substrate 100 may be additionally removed to expose a lower end of the plug 142. Alternatively, when the hole 102 may be exposed through the lower surface of the semiconductor substrate 100, the process for removing the lower surface of the semiconductor substrate 100 may be omitted.

FIGS. 9 to 16 are cross-sectional views illustrating a method of manufacturing a semiconductor device in accordance with other example embodiments.

Figure 9:
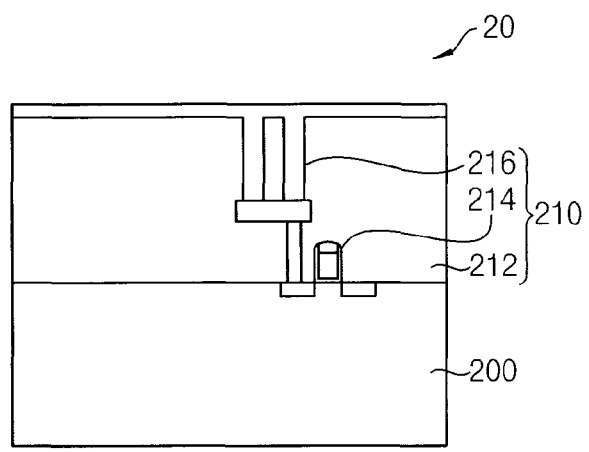

Referring to FIG. 9, a front end of line (FEOL) process may be performed on a semiconductor substrate 200 to form a semiconductor structure 210. A part 20 of a semiconductor chip may include semiconductor substrate 200 and the semiconductor structure 210. In example embodiments, the semiconductor structure 210 may include an insulating interlayer 212, a transistor 214 and a metal contact 216. The semiconductor structure 210 may include elements substantially the same as those of the semiconductor structure 110 in FIG. 1. Thus, any further illustrations with respect to the semiconductor structure 210 may be omitted herein for brevity. In one embodiment, the FEOL process may refer to a process including only forming the metal contact 216 and not including forming the transistor 214.

Figure 10:
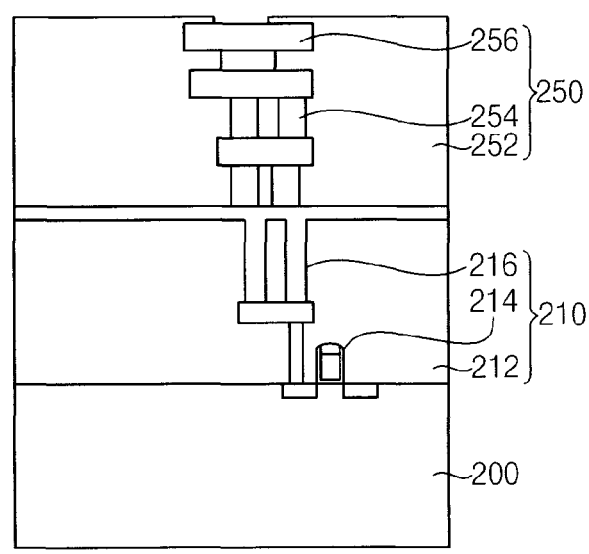

Referring to FIG. 10, a back end of line (BEOL) process may be performed on the part 20 of a semiconductor chip to form a wiring structure 250. The wiring structure 250 may be electrically connected to the semiconductor structure 210. In example embodiments, the wiring structure 250 may include a passivation layer 252, a metal contact 254 and a pad 256. The wiring structure 250 may include elements substantially the same as those of the wiring structure 150 in FIG. 8. Thus, any further illustrations with respect to the wiring structure 250 may be omitted herein for brevity.

Figure 11:
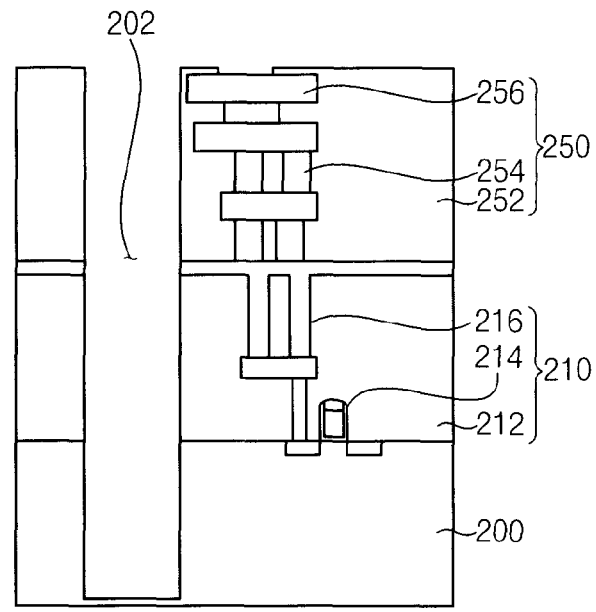

Referring to FIG. 11, a hole 202 may be vertically formed through the part 20 and the wiring structure 250 of the semiconductor chip. In example embodiments, the hole 202 may be formed from an upper surface of the wiring structure 250 toward a lower surface of the semiconductor substrate 200. The hole 202 may have a first sidewall and a second sidewall opposite to the first sidewall. The hole 202 may not be exposed through the lower surface of the semiconductor substrate 200. Alternatively, the hole 202 may be exposed through the lower surface of the semiconductor substrate 200.

Figure 12:
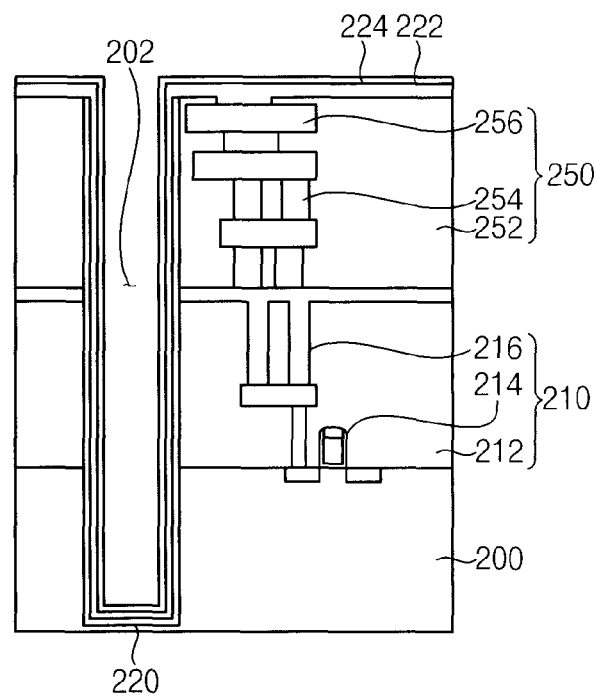

Referring to FIG. 12, an insulating liner 220 may be formed on an inner surface of the hole 202. A metal barrier layer 222 and a seed layer 224 may be sequentially formed on the insulating liner 220 and on the wiring structure 250 of a semiconductor chip.

Figure 13:
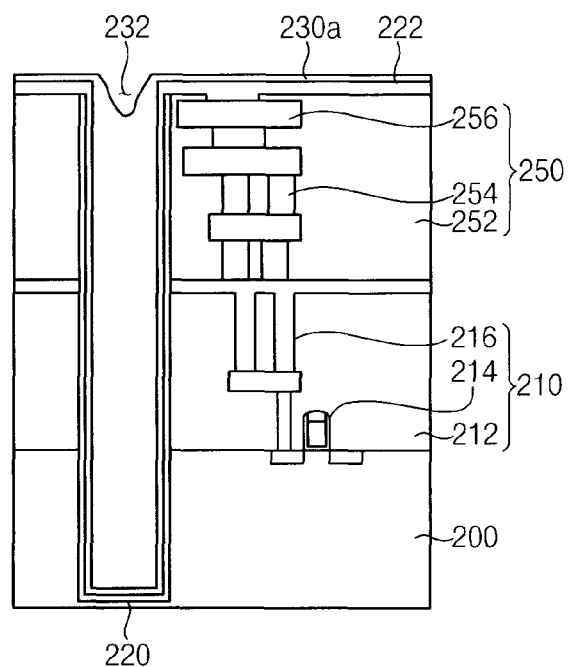

Referring to FIG. 13, a plating process may be performed on the seed layer 224 to form a preliminary plug, such as a first preliminary plug 230a in the hole 202 and on the upper surface of the wiring structure 250 of a semiconductor chip. The first preliminary plug 230a may be grown from the seed layer 224. In example embodiments, the first preliminary plug 230a may be formed in the hole 202 and on the upper surface of the wiring structure 250 of a semiconductor chip. The first preliminary plug 230a may be electrically connected to the wiring structure 250.

In example embodiments, the first preliminary plug 230a may have a first dimple 232 (e.g., recess). The first preliminary plug 230 may have a structure substantially the same as that of the first preliminary plug 130 in FIG. 4. Thus, any further illustrations with respect to a process for forming the first preliminary plug 230a may be omitted herein for brevity.

Figure 14:
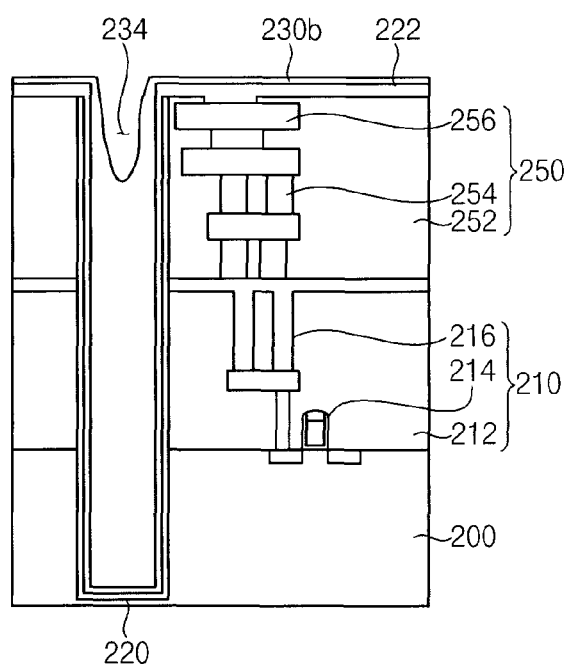

Referring to FIG. 14, if the first dimple 232 has a size smaller than an amount that the first preliminary plug 230a is expected to expand, a bottom surface of the first dimple 232 may be partially removed to form a second dimple 234 having a depth deeper than that of the first dimple 232. In example embodiments, a process for forming the second dimple 234 may be substantially the same as a process for forming the second dimple 134 illustrated with reference to FIG. 5. Thus, any further illustrations with respect to the process for forming the second dimple 234 may be omitted herein for brevity. However, if the first dimple 232 may have a large size configured to sufficiently receive the expanded portion of the first preliminary plug 230a, the process for forming the second dimple 234 may be omitted.

Figure 15:
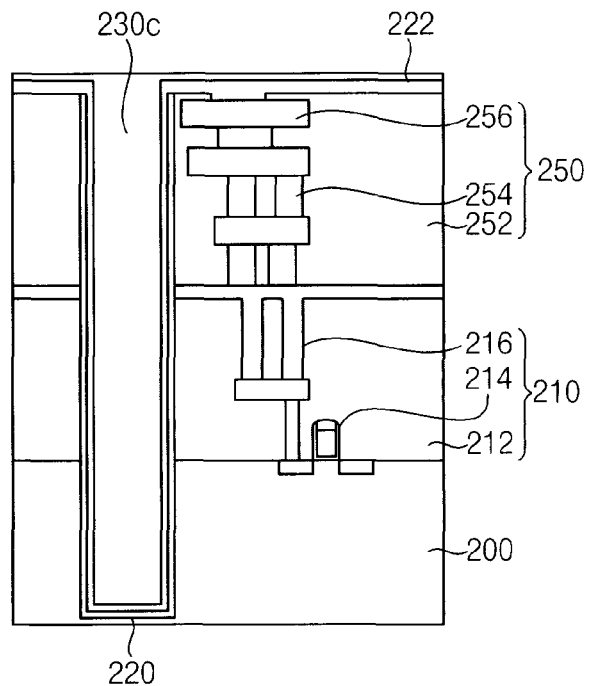

Referring to FIG. 15, the first or second preliminary plug 230a, 230b may then be thermally treated. The first or second preliminary plug 230a, 230b may be expanded into the first dimple 232 or the second dimple 234, respectively, to form a third preliminary plug 230c without the first dimple 232 or the second dimple 234. In example embodiments, a process for forming the third preliminary plug 230c may be substantially the same as a process for forming the third preliminary plug 130c illustrated with reference to FIG. 6. Thus, any further illustrations with respect to the process for forming the third preliminary plug 230c may be omitted herein for brevity.

Figure 16:
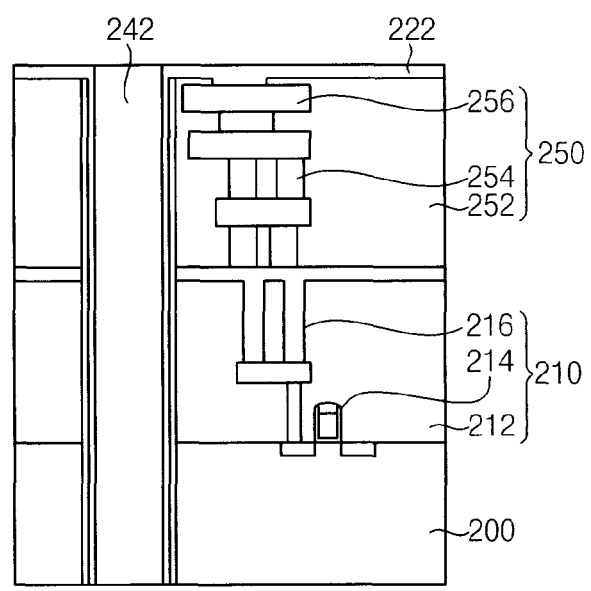

Referring to FIG. 16, a CMP process may be performed on the third preliminary plug 230c until the portion of the third preliminary plug 230c may be removed to form a plug 242. In example embodiments, the plug 242 may be electrically connected to the wiring structure 250.

In example embodiments, the lower surface of the semiconductor substrate 200 may be additionally removed to expose a lower end of the plug 242. Alternatively, when the hole 202 may be exposed through the lower surface of the semiconductor substrate 200, the process for removing the lower surface of the semiconductor substrate 200 may be omitted.

In one embodiment, a semiconductor chip may include the semiconductor substrate 200, the semiconductor structure 210, the wiring structure 250, and the plug 242.

Method of Manufacturing a Semiconductor Package

Figure 17:
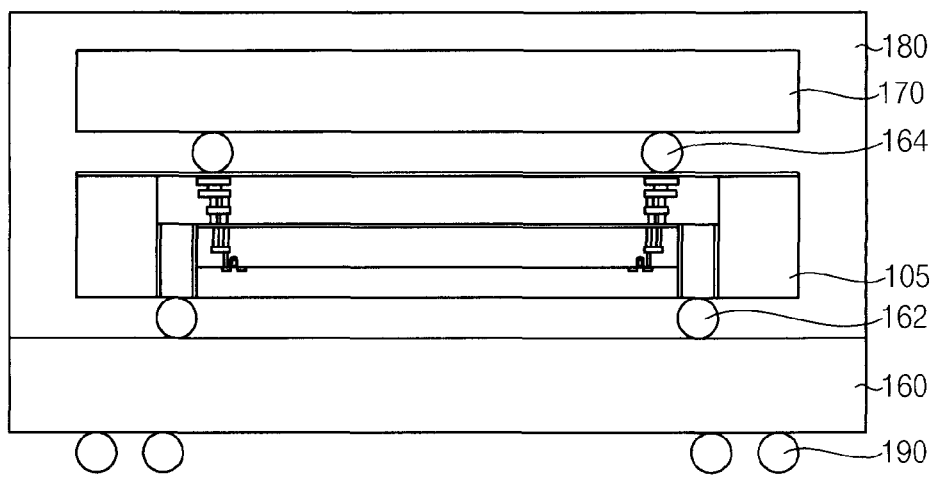

FIG. 17 is a cross-sectional view illustrating a method of packaging the semiconductor device in FIG. 8 according to one embodiment.

Referring to FIG. 17, the semiconductor substrate 100 on which the processes illustrated with reference to FIGS. 1 to 8 may be performed may be cut along a scribe lane to form a first semiconductor chip 105.

The first semiconductor chip 105 may be arranged over a package substrate 160. A first conductive bump 162 may be interposed between the lower end of the plug 142 and the package substrate 160. A reflow process may be performed on the first conductive bump 162 to electrically connect the first semiconductor chip 105 to the package substrate 160 via the first conductive bump 162. Thus, the first semiconductor chip 105 may be electrically connected to the package substrate 160 via the plug 142 and the first conductive bump 162. In example embodiments, the first conductive bump 162 may include a solder bump.

A second semiconductor chip 170 may be arranged over the first semiconductor chip 105. A second conductive bump 164 may be interposed between the wiring structure 150 and the second semiconductor chip 170. A reflow process may be performed on the second conductive bump 164 to electrically connect the second semiconductor chip 170 to the first semiconductor chip 105 via the second conductive bump 164. Thus, the second semiconductor chip 170 may be electrically connected to the first semiconductor chip 105 via the plug 142, the wiring structure 150, and the second conductive bump 164. In example embodiments, the second conductive bump 164 may include a solder bump.

In one embodiment, the first semiconductor chip 105 may connect to the second semiconductor chip 170 and the package substrate 160 in an opposite direction than shown in FIG. 17. That is, the plug 142 may contact the second conductive bump 164, and the wiring structure 150 may contact the first conductive bump 162.

In example embodiments, the two reflow processes may be individually performed on the first conductive bump 162 and the second conductive bump 164. Alternatively, only one reflow process may be performed on the first conductive bump 162 and the second conductive bump 164.

A molding member 180 may be formed on the package substrate 160 to cover the first semiconductor chip 105 and the second semiconductor chip 170. The molding member 180 may protect the first semiconductor chip 105 and the second semiconductor chip 170 from external environments. In example embodiments, the molding member 180 may include an epoxy molding compound (EMC).

External terminals 190 may be mounted on a lower surface of the package substrate 160 to complete a semiconductor package. In example embodiments, the external terminals 190 may include solder balls.

Figure 18:
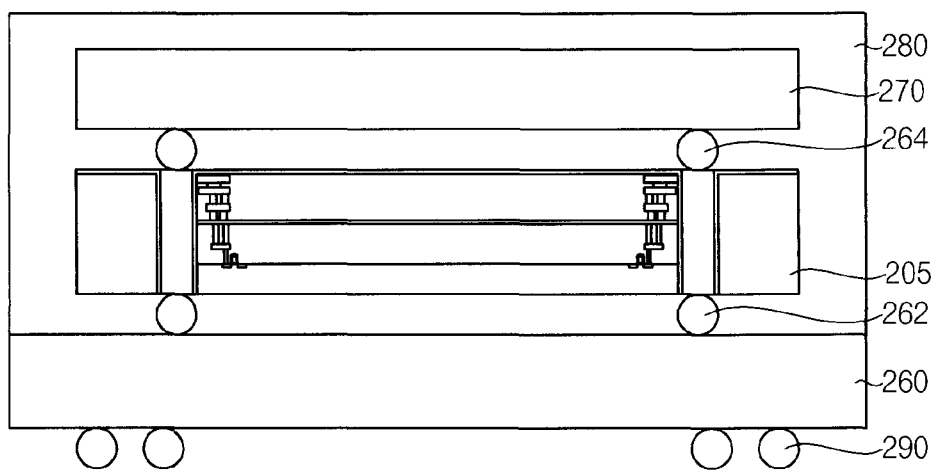

FIG. 18 is a cross-sectional view illustrating a method of packaging the semiconductor device in FIG. 16 according to one embodiment.

Referring to FIG. 18, the semiconductor substrate 200 on which the processes illustrated with reference to FIGS. 9 to 16 may be performed may be cut along a scribe lane to form a first semiconductor chip 205.

The first semiconductor chip 205 may be arranged over a package substrate 260. A first conductive bump 262 may be interposed between the lower end of the plug 242 and the package substrate 260. A reflow process may be performed on the first conductive bump 262 to electrically connect the first semiconductor chip 205 to the package substrate 260 via the first conductive bump 262. Thus, the first semiconductor chip 205 may be electrically connected to the package substrate 260 via the plug 242 and the first conductive bump 262. In example embodiments, the first conductive bump 262 may include a solder bump.

A second semiconductor chip 270 may be arranged over the first semiconductor chip 205. A second conductive bump 264 may be interposed between the upper end of the plug 242 and the second semiconductor chip 270. A reflow process may be performed on the second conductive bump 264 to electrically connect the second semiconductor chip 270 to the first semiconductor chip 205 via the second conductive bump 264. Thus, the second semiconductor chip 270 may be electrically connected to the first semiconductor chip 205 via the plug 242 and the second conductive bump 264. In example embodiments, the second conductive bump 264 may include a solder bump.

In example embodiments, the two reflow processes may be individually performed on the first conductive bump 262 and the second conductive bump 264. Alternatively, only one reflow process may be performed on the first conductive bump 262 and the second conductive bump 264.

A molding member 280 may be formed on the package substrate 260 to cover the first semiconductor chip 205 and the second semiconductor chip 270. The molding member 280 may protect the first semiconductor chip 205 and the second semiconductor chip 270 from external environments. In example embodiments, the molding member 280 may include an epoxy molding compound (EMC).

External terminals 190 may be mounted on a lower surface of the package substrate 160 to complete a semiconductor package. In example embodiments, the external terminals 190 may include solder balls.

According to some example embodiments, the preliminary plug may be expanded into the dimple by the thermal treatment process. Thus, the plug may not have a protrusion protruded from the upper surface of the semiconductor chip. As a result, the plug may be formed by the single CMP process.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising:
   performing a front end of line (FEOL) process on a semiconductor substrate to form a semiconductor structure;
   performing a back end of line (BEOL) process on the semiconductor structure to form a wiring structure electrically connected to the semiconductor structure, thereby forming a semiconductor chip;
   forming a hole through a part of the semiconductor chip;
   forming a preliminary plug, the preliminary plug having a dimple in the hole; and
   thermally treating the preliminary plug until the preliminary plug is expanded into the dimple.

2. The method of claim 1, wherein the dimple has a volume of no more than 2% of a volume of the hole.

3. The method of claim 1, wherein forming the hole and the preliminary plug comprises:
   forming a hole through the semiconductor substrate;
   forming a seed layer on an inner surface of the hole; and
   performing a plating process on the seed layer.

4. The method of claim 1, further comprising:
   forming the preliminary plug includes forming a vertical plug in the hole and forming a plating material on the part of the semiconductor chip adjacent to the hole; and
   removing a portion of the preliminary plug.

5. The method of claim 4, further comprising removing the portion of the preliminary plug by using a chemical mechanical polishing (CMP) process.

6. The method of claim 1, wherein the thermal treatment process comprises an annealing process performed at a temperature of 400° C. to 500° C.

7. The method of claim 1, further comprising removing a bottom surface of the dimple to further form the preliminary plug to have a second dimple that has a depth deeper than that of the dimple.

8. The method of claim 7, wherein the bottom surface of the dimple is removed by a wet-etching process.

9. The method of claim 1, wherein forming the preliminary plug comprises electrically connecting the preliminary plug to the semiconductor structure.

10. The method of claim 1, wherein forming the preliminary plug comprises electrically connecting the preliminary plug to the wiring structure.

11. A method of manufacturing a semiconductor package, the method comprising:
  performing a front end of line (FEOL) process and a back end of line (BEOL) process on a semiconductor substrate to form a first semiconductor chip;
  forming a hole through at least part of the first semiconductor chip;
  forming a vertical plug in the hole, the vertical plug having a dimple;
  thermally treating a material comprising the vertical plug until the material is expanded into the dimple to form a plug;
  stacking the first semiconductor chip on a package substrate, the first semiconductor chip electrically connected to the package substrate; and
  stacking a second semiconductor chip on the first semiconductor chip, the plug electrically connected to the second semiconductor chip.

12. The method of claim 11, further comprising prior to thermally treating the material comprising the vertical plug, removing a bottom surface of the dimple to form a second vertical plug having a second dimple that has a depth deeper than that of the dimple.

13. The method of claim 11, further comprising forming a molding member on an upper surface of the package substrate to cover the first semiconductor chip and the second semiconductor chip.

14. The method of claim 11, wherein the dimple has a volume that is less than 2% of a volume of the hole.

* * * * *